(12) United States Patent
Sekine

(10) Patent No.: US 7,593,049 B2
(45) Date of Patent: Sep. 22, 2009

(54) CMOS IMAGE SENSOR

(75) Inventor: Hirokazu Sekine, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1110 days.

(21) Appl. No.: 10/675,960

(22) Filed: Oct. 2, 2003

(65) Prior Publication Data

US 2004/0108525 A1    Jun. 10, 2004

(30) Foreign Application Priority Data

Oct. 2, 2002    (JP) .............................. 2002-289789

(51) Int. Cl.
H04N 5/335    (2006.01)
H01L 31/112    (2006.01)

(52) U.S. Cl. .................. 348/308; 257/291; 257/292; 257/293

(58) Field of Classification Search ................. 348/308; 250/208.1; 257/72, 88, 291–293, 440
See application file for complete search history.

(56) References Cited

U.S. PATENT DOCUMENTS 4,602,289 A    7/1986 Sekine 5,793,071 A    8/1998 Sekine
6,956,605 B1 *    10/2005 Hashimoto .................. 348/301

OTHER PUBLICATIONS

T. Yamada, et al., IEEE Journal of Solid-State Circuits, vol. 35, No. 12, pp. 2044-2054, "A Progressive Scan CCD Image Sensor for DSC Applications", Dec. 2000.

* cited by examiner

Primary Examiner—Tuan V Ho
Assistant Examiner—Selam T Gebriel
(74) Attorney, Agent, or Firm—Oblon, Spivak, McClelland, Maier & Neustadt, P.C.

(57) ABSTRACT

In the pixel portions of the CMOS image sensor, a plurality of unit cells are arranged in the row and column directions at a predetermined pitch respectively in a two-dimensional plain forming a matrix. Each unit cell includes the first and second photodiodes PDa and PDb, the first and second transfer transistors Ta and Tb for transferring the stored charges of the photodiodes to their common floating junctions FJ, the reset transistors R for resetting the potential of the floating junctions FJ, the driver transistors D whose output potential is controlled by the potential of the floating junctions FJ, and the address transistors A for selectively driving the driver transistors D. With the arrangement of the elements and wires in the pixel portions, the integration can be increased and the resolution in the horizontal and vertical directions can be improved.

20 Claims, 7 Drawing Sheets

CMOS IMAGE SENSOR

BACKGROUND OF THE INVENTION

The present invention relates to a CMOS image sensor having one unit cell composed of two pixels, which is suited to a solid image pick up device such as a digital camera or a camera system for mobile equipment.

As well known, a CMOS image sensor can be manufactured by the CMOS technology, which is widely used for manufacturing semiconductor devices having a small size and low power consumption and which can install a peripheral circuit such as a signal processor together with the image sensors in one chip. Thus, the CMOS image sensor is noticed as an alternative device to a CCD device conventionally used as an image pick up device.

A conventional CMOS image sensor is known, in which a unit cell Ce forming a pixel portion has two photodiodes PDa and PDb and one floating junction FJ, which is shared by the photodiodes PDa and PDb.

However, the conventional CMOS image sensor has pixels, which are arranged in a matrix having horizontal and vertical pitches of Ph and Pv respectively, which provide so long intervals between adjacent pixels in the horizontal and vertical directions that information between pixels cannot be picked up. Therefore, a problem arises that sufficient resolution of the sensor cannot be obtained. As a means for improving the resolution of the sensor, high integration of the sensor is conceivable. However, there is a limit in making the diodes and transistor elements constituting the pixel portion be reduced in their sizes and in making fine wires, thus there is also a limit in the improvement of the resolution of the sensor.

The present invention is made in view of the above-mentioned circumstances and it is therefore one of the objects of the present invention is to provide a CMOS image sensor, which make it possible to increase the integration by efficiently arranging elements and wires constituting the pixel portions without making the elements and wires small or fine and thereby to improve the resolution in the horizontal and vertical directions.

BRIEF SUMMARY OF THE INVENTION

A CMOS image sensor according to an embodiment of the present invention has a plurality of unit cells arranged in the row and column directions at a predetermined pitch respectively in a two-dimensional plain forming a matrix, which include a first and a second photoelectric conversion element, a first and a second transfer transistor for transferring charges stored by the photoelectric conversion elements at their common floating junctions, reset transistors for resetting the potential of the floating junctions, driver transistors whose output potential is controlled by the potential of the floating junctions, and address transistors for selectively driving the driver transistors. The CMOS image sensor further includes reset drain voltage lines provided in the column direction of the matrix arrangement for resetting the potential of the common floating junctions included in the unit cell belonging to each column of the matrix arrangement, first transfer lines provided in the row direction of the matrix arrangement for controlling the first transfer transistor included in the unit cell belonging to each row, second transfer lines in the row direction of the matrix arrangement for controlling the second transfer transistors included in the unit cells belonging to each row of the matrix arrangement, signal output lines provided in the column direction of the matrix arrangement to which the output voltages of the driver transistors included in the unit cells belonging to each column of the matrix arrangement are supplied, and address lines provided in the row direction of the matrix arrangement for selectively driving the driver transistors included in the unit cell belonging to each row.

Further, a CMOS image sensor according to an embodiment of the present invention has a plurality of unit cells arranged in the row and column directions at a predetermined pitch respectively in a two-dimensional plain forming a matrix, which include a first and a second photoelectric conversion element, a first and a second transfer transistor for transferring charges stored by the photoelectric conversion elements at their common floating junctions, reset transistors for resetting the potential of the floating junctions, driver transistors whose output potential is controlled by the potential of the floating junctions, and address transistors for selectively driving the driver transistors. The CMOS image sensor further includes reset drain voltage lines provided in the column direction of the matrix arrangement for resetting the potential of the common floating junctions included in the unit cell belonging to each column of the matrix arrangement, first transfer lines provided in the row direction of the matrix arrangement for controlling the first transfer transistor included in the unit cell belonging to each row, second transfer lines in the row direction of the matrix arrangement for controlling the second transfer transistors included in the unit cells belonging to each row of the matrix arrangement, first signal output lines provided in the column direction of the matrix arrangement to which the output voltages of the driver transistors included in the unit cells arranged in the odd numbered rows are supplied, second signal output lines provided in the column direction of the matrix arrangement to which the output voltages of the driver transistors included in the unit cells arranged in the even numbered rows are supplied, and address lines provided in the row direction of the matrix arrangement for selectively driving the driver transistors included in the unit cell belonging to each row, wherein image signals of the pixel arrays composed of the photoelectric conversion elements included in the unit cells arranged in the neighboring two columns are read simultaneously using the first and second signal output lines.

Furthermore, in the CMOS image sensor according to still another embodiment of the present invention, each gate of the address transistor included in the unit cell arranged in the first column is connected to each corresponding gate of the reset transistor included in the unit cell arranged in the adjacent second column, wherein while the image signals from the second photoelectric conversion elements included in the unit cells arranged in the first column are read, the floating junctions included in the unit cells arranged in the second column, which should be read in the next time are reset, and thus the image signal from the first photoelectric conversion elements included in the unit cells arranged in the second column can be read.

DETAILED DESCRIPTION OF THE INVENTION

The preferred embodiments of the present invention will be explained below with reference to the accompanying drawings.

Figure 1:
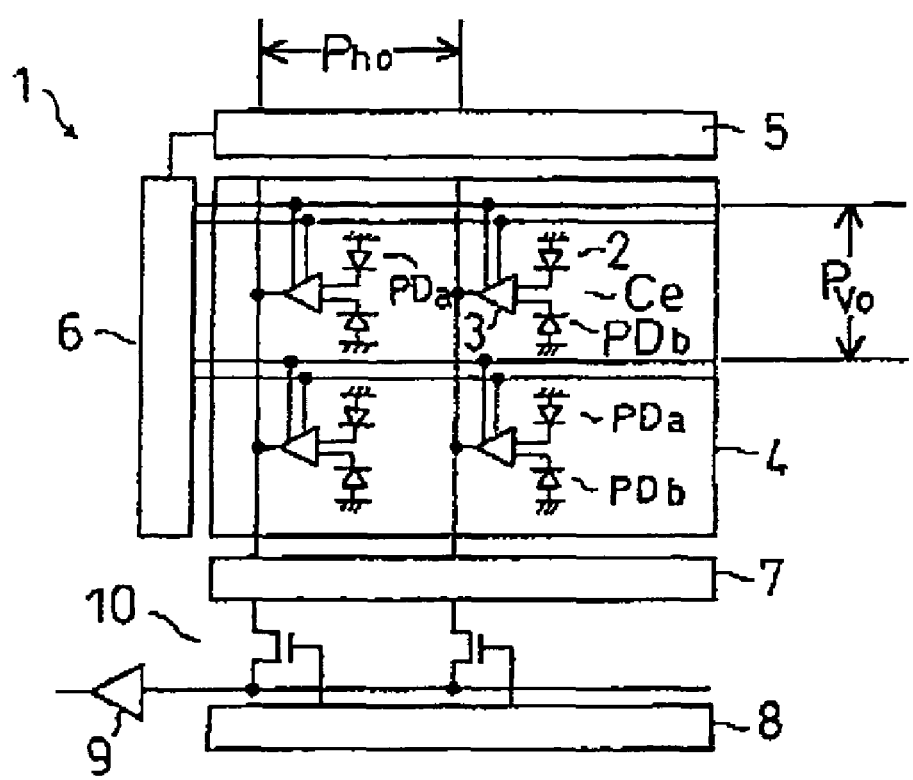
FIG. 1 is a block diagram showing an entire structure of a CMOS image sensor in the embodiment of the present invention.

FIG. 1 is a block diagram showing an entire structure of the CMOS image sensor according to an embodiment of the present invention.

The CMOS image sensor has a pixel portion 4, in which each of a plurality of unit cells Ce is composed of a pixel 2 including two photodiodes PDa and PDb and a pixel amplifier 3. In the pixel portion 4, the unit cells Ce are arranged in the row and column directions at a predetermined pitch of Pho and Pvo respectively in a two-dimensional plain forming a matrix.

Further, around the pixel portion 4, a timing generation circuit 5, a vertical line scanning circuit 6, a noise cancel circuit 7, a horizontal line scanning circuit 8 and an output amplifier 9 are arranged to form a reading unit 10.

Figure 2:
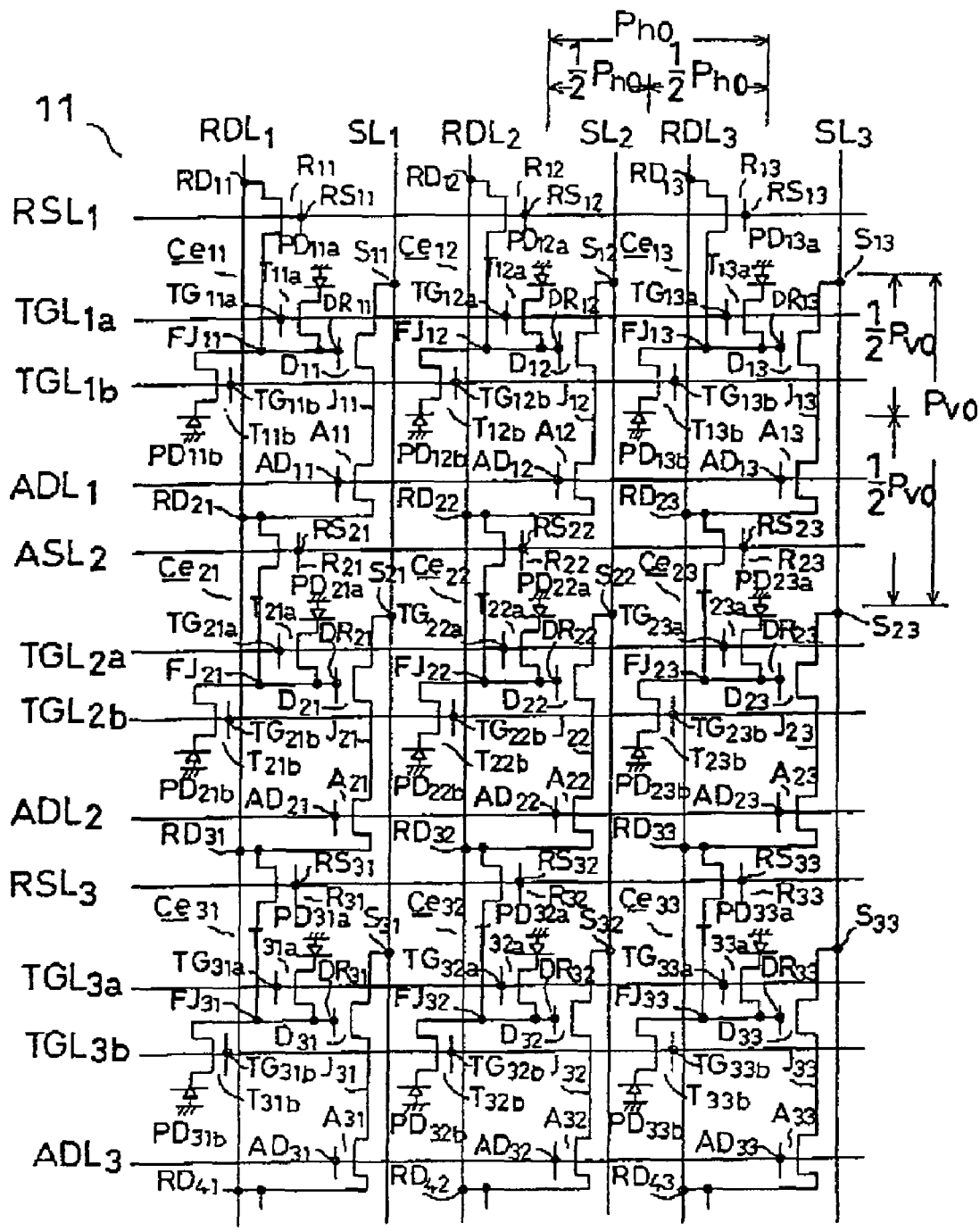
FIG. 2 is a circuit diagram of a pixel portion of the image sensor shown in FIG. 1.

FIG. 2 is a circuit diagram showing the pixel portion 4 of the image sensor shown in FIG. 1. In the drawing, a pixel portion 11 is a circuit diagram showing a part of the pixel portion 4 shown in FIG. 1. In the pixel portion 11, the photodiodes PDa and PDb respectively constitute one pixel and the two photodiodes PDa and PDb constitute one unit cell Ce. The unit cells Ce are arranged in the row and column directions at a predetermined pitch of Ph0 and Pv0 respectively in a two-dimensional plain forming a matrix Further, each unit cell Ce in the pixel portion 11 further includes two transfer transistors Ta and Tb, a reset transistor R, a driver transistor D, and an address transistor A in addition to a pair of photodiodes PDa and PDb. The pixel portion 11 is formed on the same semiconductor substrate using the integrated circuit technology.

In FIG. 2, the two photodiodes included in each unit cell Ce are indicated as PD11a, PD11b, PD12a, PD12b, - - -, according to the position in the matrix arrangement. However, hereinafter, when the two photodiodes are representatively explained regardless of their positions, they are indicated as PDa and PDb. Further, the other elements constituting each unit cell Ce are also indicated in the same way.

In FIG. 2, the two photodiodes PDa and PDb are respectively connected to source electrodes of the corresponding transfer transistors Ta and Tb. Transfer pulses for reading pixel signals are respectively applied to gates TGa and TGb of the transfer transistors Ta and Tb from transfer lines TGLa and TGLb. Further, the floating junctions FJ, which are drain electrodes of the transfer transistors Ta and Tb, are connected to the source electrodes of the reset transistor R and a gate DR of the driver transistor D.

Furthermore, the drain electrodes of the reset transistor R are connected to a reset drain voltage line RDL and a gate RS is connected to a reset line RSL. The reset line RSL applies a pulse for resetting the floating junction FJ to a predetermined reset drain voltage to the gate RS.

Source electrodes of the driver transistors D are connected to a signal output line SL and drain electrodes of which are connected to source electrodes of address transistors A via a junction areas J. Further, the drain electrodes of the address transistors A are connected to reset drain voltage lines RDL and a gate AD of which are connected to address lines ADL. The address lines ADL provide the gate AD with address pulses for selecting the address transistors A arranged in the horizontal direction. By selecting the address transistors A, pixel signals are read out to the signal output lines SL via the corresponding driver transistors D.

The pixel portion 11, as mentioned above, is composed of a plurality of unit cells Ce arranged in a matrix. Noticing the photodiodes PDa and PDb, which are corresponded to the respective pixels in the pixel portion 11, the photodiodes PDa constituting the respective unit cells Ce and arranged in a horizontal row form a first pixel line. Similarly, the photodiodes PDb constituting the respective unit cells Ce and arranged in a horizontal row form a second pixel line adjacent to the first pixel line. Thus, the adjacent first and second pixel lines are formed repeatedly in the vertical direction.

The photodiodes PDa in the first pixel lines are arranged at predetermined pitches of Ph0 and Pv0, which are equal to the pitches of the unit cells Ce arrangement in the horizontal and vertical directions. The photodiodes PDb in the second pixel lines are also arranged at the predetermined pitches of Ph0 and Pv0, which are equal to the pitches of the unit cells Ce arrangement in the horizontal and vertical directions.

The photodiodes PDa arranged in the first pixel lines and the photodiodes PDb arranged in the second pixel lines are dislocated by Ph0/2 and Pv0/2 respectively in the horizontal and vertical directions and are arranged checker wise as a whole. Further, when the unit cells Ce are arranged in a square matrix, Ph0 becomes equal to Pv0 and the pixel pitches in the horizontal and vertical directions are made equal to each other. As a result, the photodiodes PDa and photodiodes PDb included in the respective unit cells Ce are slanted by 45 degrees.

Figure 3:
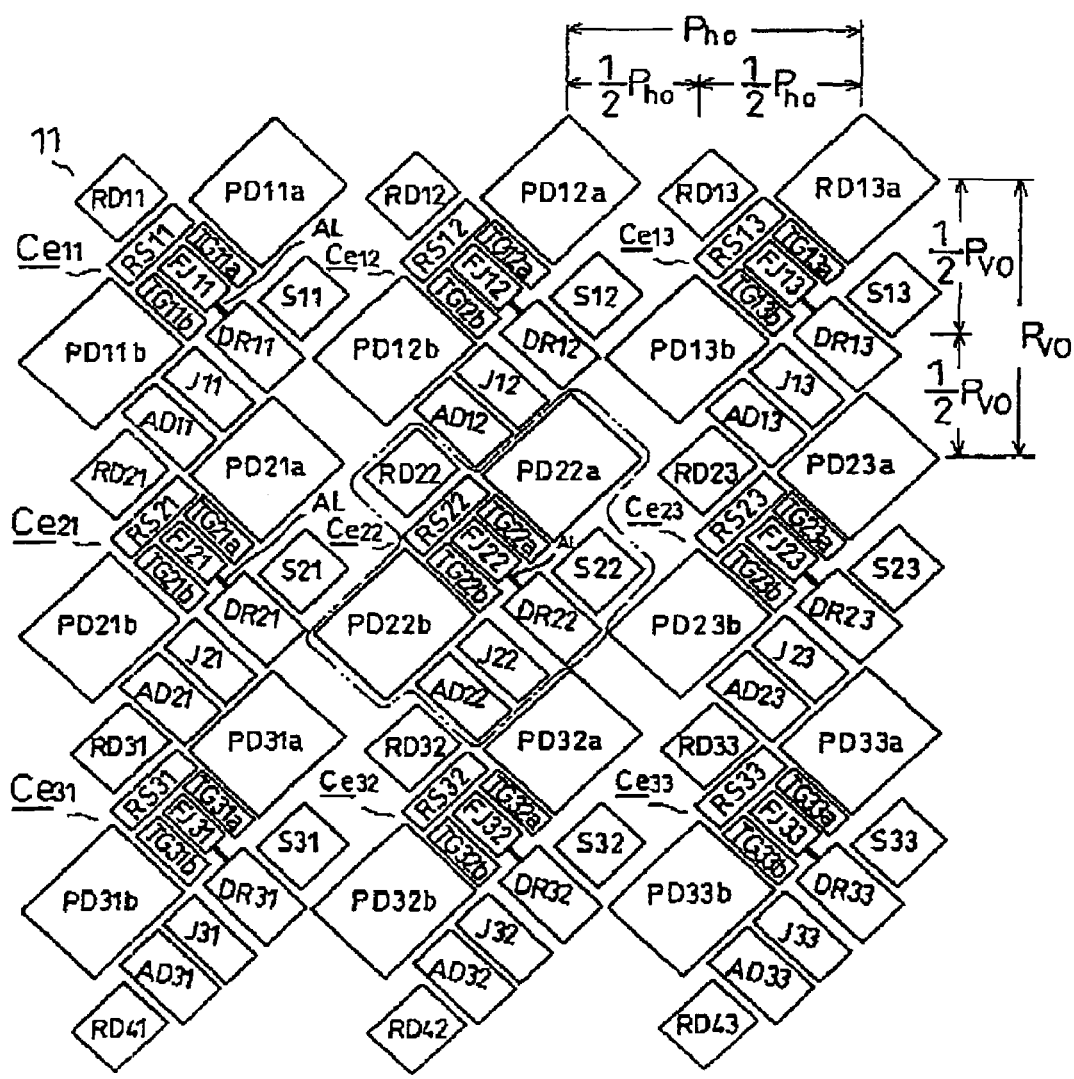
FIG. 3 is a drawing showing an IC circuit pattern constituting the pixel portion shown in FIG. 2.

FIG. 3 shows an IC circuit pattern forming the pixel portion shown in FIG. 2.

Noticing a unit cell Ce 22 positioned at the center in the drawing, a unit cell Ce 21 and a unit cell Ce 23 are located adjacent to the unit cell Ce 22 in the horizontal direction and a unit cell Ce 12 and a unit cell Ce 32 are located adjacent to the unit cell Ce 22 in the vertical direction. A pair of photodiodes PD22a and PD22b of the unit cell Ce 22 are spaced by Ph0/2 and Pv0/2 in the horizontal and vertical directions with each other and are indicated with a rectangle inclined by 45 degrees.

Between the two photodiodes PD22a and PD22b, gates TG22a and TG22b of the transfer transistors T22a and T22b a replaced side by side. Between the gates TG22a and TG22b, a floating junction FJ22 is placed. In the neighborhood of the floating junction FJ22, a gate RS22 of the reset transistor R22 is placed. Source electrodes of the transistor R22 are connected to the floating junction FJ22.

In the neighborhood of the gate RS22 of the reset transistor R22, a reset drain area RD22 is provided, to which drain electrodes of the reset transistor R22 are connected.

On the opposite side of the gate RS22 to the floating junction FJ22, a gate DR22 of the driver transistor D22 is adjacently placed on both sides of the gate DR22, a diffusion area S22 and a junction area J22 are placed. The diffusion area S22 corresponds to the connecting portion of the source electrodes of the driver transistor D22 with the signal output line S2. The junction area J22 corresponds to the connecting portion of the drain electrodes of the driver resistor D22 with the source electrodes of the address transistor A22. Furthermore, in the neighborhood of the junction area J22, a gate AD22 of the address transistor A22 is placed.

Further, the floating junction FJ22 and the gate DR22 of the driver transistor D22 are connected by a metallic line AL such as aluminum.

The other unit cells Ce11, ce12, - - - are also formed with the same circuit pattern as the aforementioned. Furthermore, although not shown in FIG. 3 but shown in the circuit diagram in FIG. 2, transfer lines TGL1a, TGL1b, TGL2a, TGL2b, - - -, reset lines RSL1, RSL2, - - -, address lines ADL1, ADL2, - - -, reset drain voltage lines RDL1, RDL2, and signal output lines SL1, sL2, - - - are formed by metallic lines such as aluminum in the corresponding respective positions.

Next, the operation of the CMOS image sensor having such a configuration will be outlined. An optical image of an object is focused on the pixel portion 11 by the optical lens system (not shown in the drawing). The optical image is converted into an electric signal by the photodiodes PDa and PDb, each of which provides at its output terminal a pixel signal corresponding to the image. The image signals are read for each pixel line constituting the pixel portion 11. For example, electric charges representing signals generated by the photodiodes PD11a, PD12a, PD13a, - - - arranged in the first row of the matrix arrangement are transferred and stored in the floating junctions FJ11, FJ12, FJ13, - - -, by applying transfer pulses to the gates TG11, TG12a, TC13a - - - of the transfer transistors T11a, T12a, T13a, - - - via the transfer line TGL1a and by opening the gates.

In this case, prior to reading such signal charges, the floating junctions FJ11, FJ12, FJ13, - - - are reset to predetermined reset drain voltages. Namely, the reset transistors R11, R12, - - - are turned from a non-conducting state to a conducting state, by providing the gates RS11, RS12, - - - with a reset pulse via the reset line RSL1, thereby reset the floating junctions FJ11, FJ12, FJ13, - - - to a fixed voltage given to the reset drain voltage lines RD11, RD12, - - - beforehand.

The voltage levels of the floating junctions FJ11, FJ12, FJ13, - - -, which are thus put into the reset state, are changed by being supplied with the signal charges from the photodiodes PD11a, PD12a, PD13a, - - - since the floating junctions FJ11, FJ12, FJ13 - - - are respectively connected to the gates DR11, DR12, DR13, - - - of the driver transistors D11, D12, D13, - - -, potential changes in the floating junctions FJ11, FJ12, FJ13, - - - cause modulation of the channel potential at the gates DR11, DR12, DR13, - - - of the driver transistors D11, D12, D13, - - -.

Next, an address pulse is applied to the gates AD11, AD12, AD13, - - - of the address transistors A11, A12, A13, - - - via the address line ADL1, thus the address transistors A11, A12, A13, - - - turned from a non- conducting state to a conducting state. Thus, the driver transistors D11, D12, D13, - - - with the channel potentials being modulated by potential changes of the floating junctions FJ11, FJ12, FJ13, - - - are connected to the reset drain voltage lines RDL1, RDL2, - - -, so that signals corresponding to the signal charges stored in the floating junctions FJ11, FJ12, FJ13, - - - are taken out to the signal output lines SL1, SL2, - - -.

When reading of the photodiodes PD11a, PD12a, PD13a, forming the first pixel line is completed, the floating junctions PJ11, FJ12, FJ13, - - - are connected again to the reset drain voltage lines RDL1, RDL2, - - - via the reset transistors R11, R12, - - - and are reset to the reset drain voltages.

Next, a transfer pulse is applied to the gates TG11b, TG12b, TC13bb, - - - of the transfer transistors T11b, T12b, T13b, - - - via the transfer line TGL1b so as to open the gates, thus signal charges generated by the photodiodes PD11, PD12b, PD13b, - - - forming the second pixel line are transferred to the floating junctions FJ11, FJ12, FJ13, - - - and stored therein. The same operation as the reading signals from the first pixel line is repeated, thus signals corresponding to the charges generated by the second pixel line are read out by the signal output lines SL1, SL2, - - -.

Furthermore, with respect to the photodiode lines forming the third and fourth pixel line, that is, the photodiodes PD21a, PD22a, PD23a, - - - and PD11b, PD12b, PD13b, - - - included in the unit cells Ce21, Ce22, - - -, the floating junctions FJ21, FJ22, FJ23, - - - are shared for reading of the signal charges in the same way as with the first and second image line.

Repeating the same reading operation, hereinafter, pixel signals are read out for all the horizontal pixel lines constituting the pixel portion 11.

The above mentioned image sensor according to the embodiment of the present invention has a characteristic that the photodiodes PD11a, PD12a, PD13a, - - -, and PD11b, PD12b, PD13b, - - - are arranged checker wise in the pixel portion 11, as shown in FIG. 2. Further, the embodiment has another characteristic that a pair of transfer lines TGL1a and TGL1b is provided between adjacent pixel lines, so that the floating junctions FJ21, FJ22, FJ23, - - - are shared by the adjacent pixel lines. Furthermore, due to the above characteristic, the embodiment has further characteristic that the reset line RSL and address line ADL are shared by the adjacent pixel lines. According to the embodiment of the image sensor having these characteristics, the integration in manufacturing with the semiconductor technology can be greatly improved without reducing the size of the elements or width of the wires.

In other aspect for the aforementioned embodiment of the present invention, it is possible to improve the integration of the IC by adopting the circuit pattern of the pixel portion 11 as shown in FIG. 3. The circuit pattern is characterized in that between the paired photodiodes, for example, photodiodes PD22a and PD22b, the gates TG22a and TG22b of the corresponding transfer transistors T22a and T22b, the floating junction FJ22, and the gate RS22 of the reset transistor R22 are placed, and that, in the neighborhood of them, the reset drain area RD22, the diffusion area S22, the gate DR22 of the driver transistor D22, the junction area J22, and the gate AD22 of the address transistor A22 are placed.

Further, since the photodiodes PD11a, PD12a, PD13a, - - -, and PD11b, PD12b, PD13b, - - - are arranged in checker wise, the pitch between adjacent photodiodes in the vertical and horizontal directions can be reduced to about a half of the pitch in the conventional image sensors having a matrix arrangement of the photodiodes and thus the resolution in the vertical and horizontal directions can be improved. In this case, the resolution in the oblique direction is reduced. However, reduction in the resolution is not questionable in particular for a regular object since the resolution of human eyes is higher in the vertical and horizontal directions than in the oblique direction and a regular object has rather more components in the vertical and horizontal directions than in the oblique direction.

Figure 4:
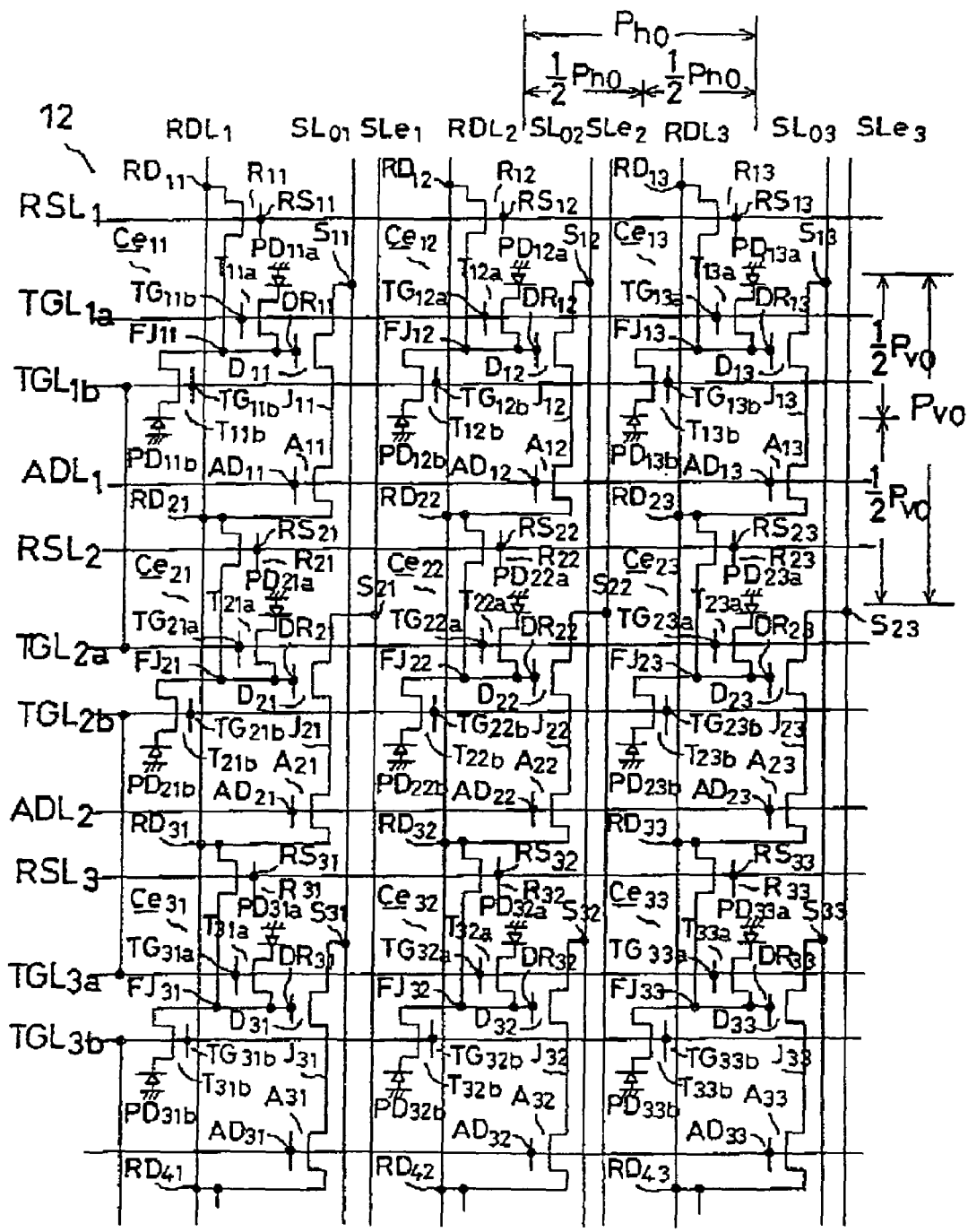
FIG. 4 is a circuit diagram showing a second embodiment of the pixel portion of the image sensor shown in FIG. 1.
Figure 5:
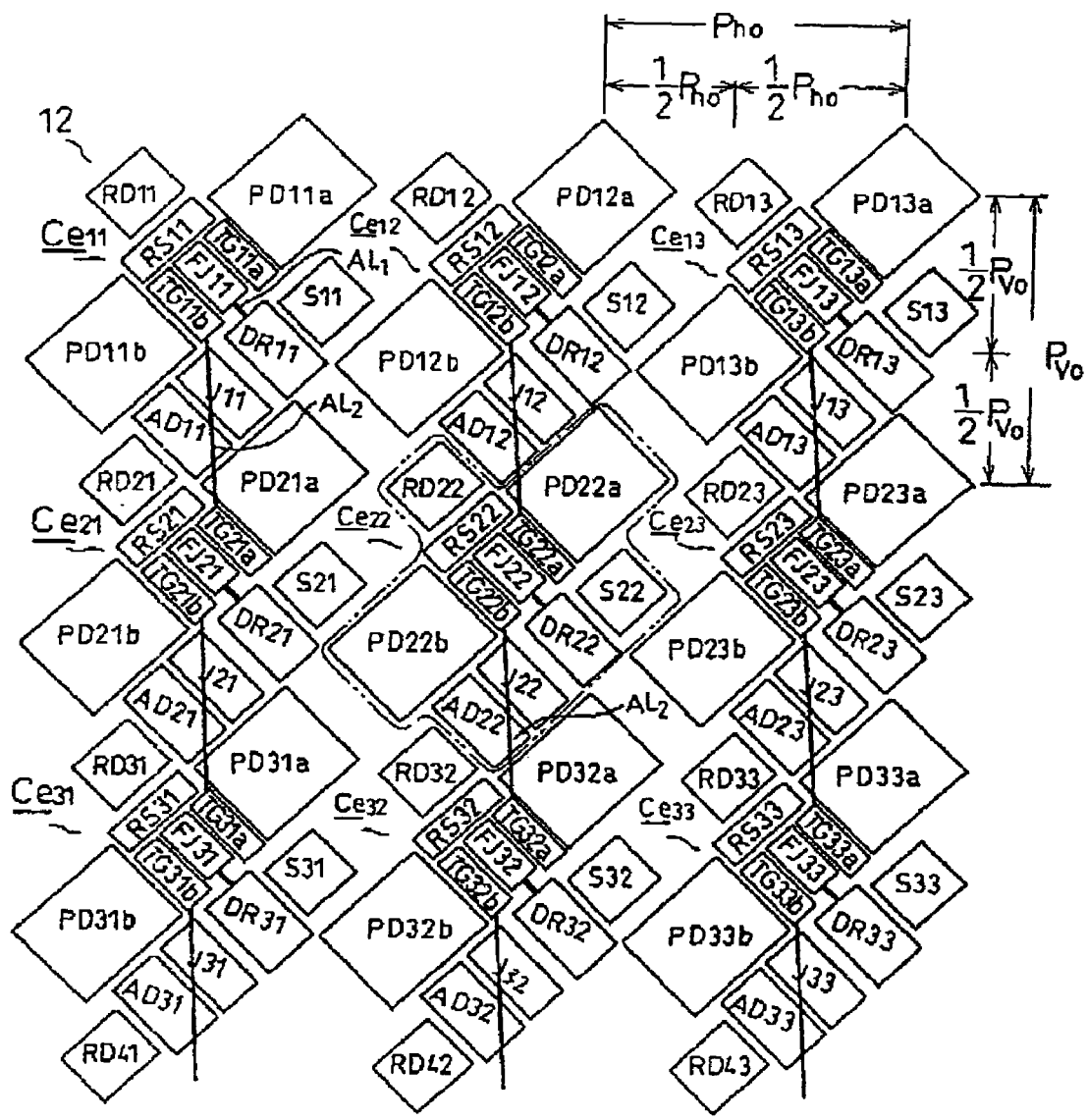
FIG. 5 is a drawing showing another IC circuit pattern constituting a pixel portion shown in FIG. 4.

The second embodiment of the present invention will be explained by referring to FIGS. 4 and 5. FIG. 4 is a circuit diagram showing the pixel portion of the image sensor shown in FIG. 1 according to the second embodiment of the present invention. FIG. 5 is a drawing showing the IC circuit pattern constituting the pixel portion shown in FIG. 4. In the following explanation, the same numerals are assigned to the same parts as those of the first embodiment, with which the detailed explanation thereof is omitted and the different parts from those of the first embodiment will be explained in detail.

In FIGS. 4 and 5, a pixel portion 12 indicates a part of the pixel portion 4 shown in FIG. 1. The basic constitution having the checker wise arrangement of the each unit cell Ce of the pixel portion 12 is the same as that of the first embodiment. Further, the circuit pattern of the unit cell Ce is also the same as that of the first embodiment.

However, the differences from the first embodiment areas follows. In the first embodiment, the signal output lines SL1, SL2, - - - are provided only one for each unit cell Ce, while in this embodiment, for example, two lines such as SLo1 and SLe1 are provided for each unit cell Ce. The signal output lines SLo1, SLo2, - - - are connected to the diffusion areas S11, S12, S13, - - - , S31, S32, S33, - - - , - - - which are connecting portions to the source electrodes of the driver transistors D11, D12, D13, - - - , D31, D32, D33, - - - , included in the unit cells Ce11, Ce12, Ce13,- - -, Ce31, Ce32, Ce33, - - - , - - - arranged in the odd numbered rows of the matrix.

In a similar way, the signal output lines SLe1, SLe2, - - - are connected to the diffusion areas S21, S22, S23, - - -, S41, S42, S43, - - - , - - - which are connecting portions to the source electrodes of the driver transistors D21, D22, D23, - - - , D41, D42, D43, - - - , - - - included in the unit cells Ce21, Ce22, Ce23, - - - , Ce41, Ce42, ce43, - - - , - - - arranged in the even numbered rows of the matrix, although unit cells Ce41, Ce42, and Ce43 are not shown in the drawings.

The second difference from the first embodiment is described below taking the unit cell Ce22 shown in FIG. 5 as an example The gate TG22a of the transfer transistor T22a for reading the photodiode PD22a of the unit cell Ce22 is connected to the gate TG12b of the transfer transistor T12b for reading the photodiode PD12b of the unit cell Ce12 with a second metallic line AL2 such as aluminum.

In a similar way, the gate TG22b of the transfer transistor T22b for reading the photodiode PD22b is connected to the gate TG32a of the transfer transistor T32a for reading the photodiode PD32a of the unit cell ce32 with the second metallic line AL2 such as aluminum. With respect to the other unit cells Ce, the same connection is provided.

In the CMOS image sensor relating to the second embodiment of the present invention having such a constitution, the signal output lines SLo1, SLo2, - - - are provided for the unit cells arranged in the neighboring odd numbered rows in the matrix arrangement, and the signal output lines SLe1, SLe2, - - - are provided for the unit cells arranged in the neighboring even numbered rows in the matrix arrangement. With this arrangement, pixel signals are read as indicated below.

With respect to the photodiodes PD11a, PD12a, PD13a, - - - in the first pixel row, signals corresponding to the charges stored are read out in the same way as in the first embodiment. With respect to the photodiodes PD11b, PD12b, PD13b, - - - in the second pixel row and the photodiodes PD21a, PD22a, PD23a, - - - in the third pixel row, signals are simultaneously output to the signal output lines SLe1, SLe2, and the signal output lines SLo1, SLo2, - - -. The reason is that with respect to the gates TG11b, TG12b, TG13b, - - - of the transfer transistors T11b, T12b, Tl3b, - - - and the gates TG21a, TG22a, TG23a, - - - of the transfer transistors T21a, T22a, T23a, - - - , the corresponding gates are connected to each other and also mutually connected to the transfer line TGL1b and TGL2a, so that transfer pulses are simultaneously applied to the gates of the transfer transistors corresponding to the photodiodes constituting the second pixel row and third pixel row.

As a result, in a signal processing for reproduction of a picture, in which signals obtained by scanning adjacent horizontal two lines are combined, there is no need to store the signals obtained by a first horizontal scanning until a second scanning is completed for a horizontal scanning period. Thus the external circuit such as a horizontal line scanning circuit is simplified.

According to the above-described embodiment, the external reading circuit is simplified, with which the integration of the circuit can be more improved, and with which the resolution in the vertical and horizontal directions are improved as in the same reason as with the first embodiment.

Figure 6:
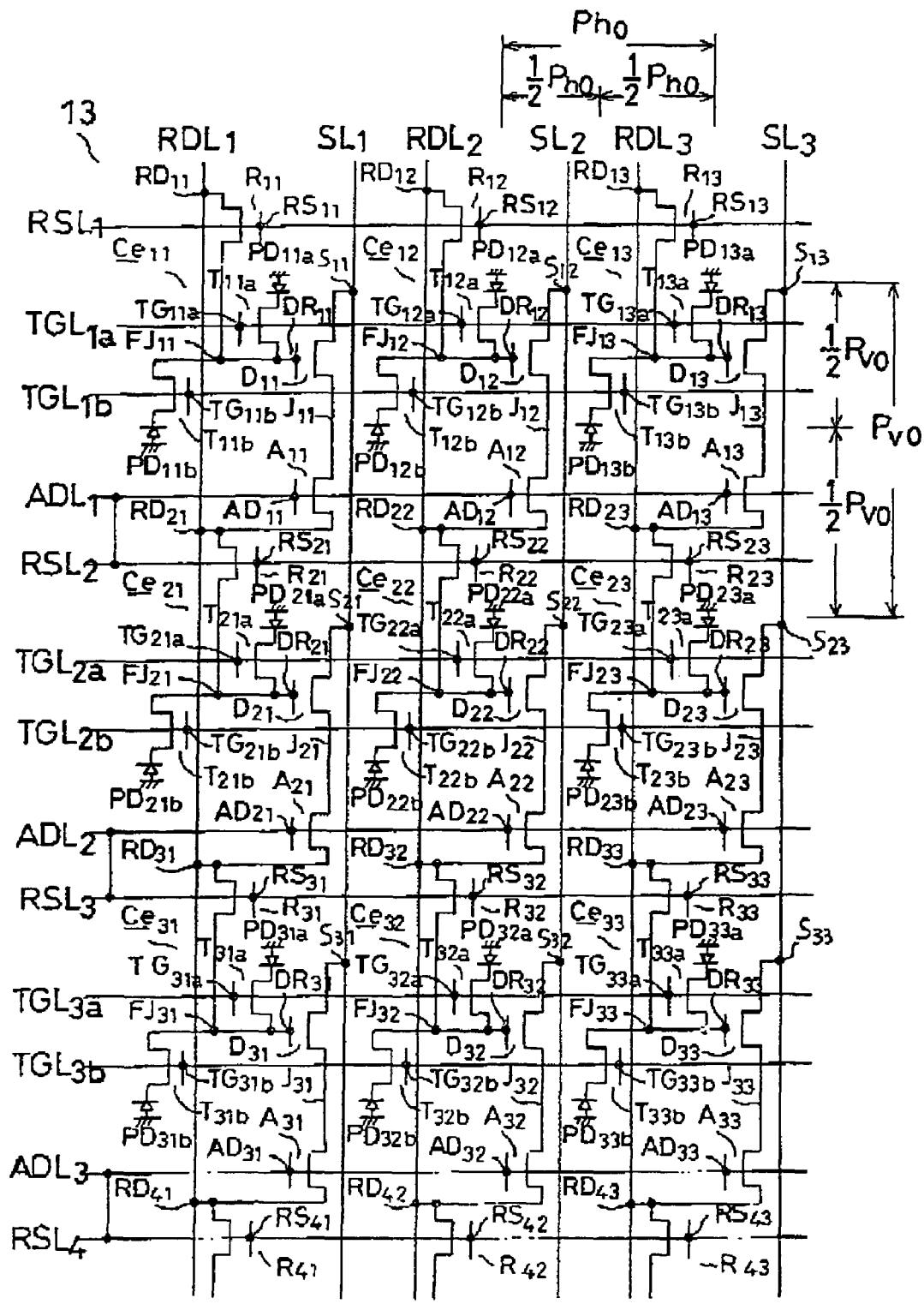
FIG. 6 is a circuit diagram showing a third embodiment of the pixel portion of the image sensor shown in FIG. 1.
Figure 7:
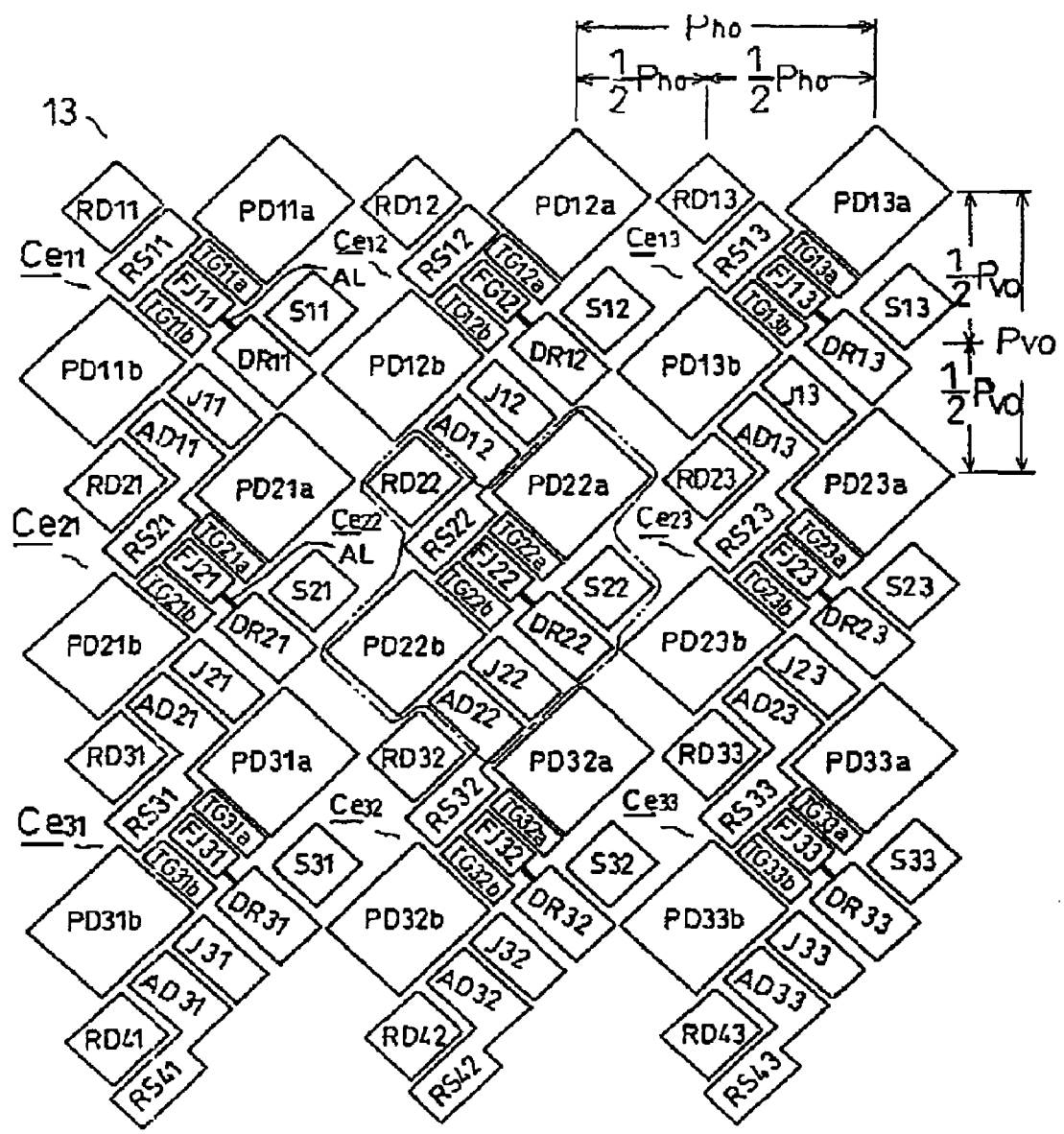
FIG. 7 is a drawing showing further IC circuit pattern constituting a pixel portion shown in FIG. 6.

The third embodiment will be explained by referring to FIGS. 6 and 7. FIG. 6 is a circuit diagram showing the third embodiment of the pixel portion of the image sensor shown in FIG. 1. FIG. 7 is a drawing showing an IC circuit pattern of the pixel portion shown in FIG. 6. In the following explanation, the same numerals are assigned to the same parts as those of the first embodiment, and the detailed explanation thereof is omitted, and the different parts from the first embodiment will be explained in detail.

In FIGS. 6 and 7, a pixel portion 13 shows a part of the pixel portion 4 of the CMOS image sensor shown in FIG. 1, au the pixel portion 11 in the first embodiment. The basic constitution having the checker wise arrangement of the each unit cell Ce of the pixel portion 13 is the same as that of the first embodiment Further, the circuit pattern of the unit cell Ce is also the same as that of the first embodiment.

However, the differences from the first embodiment are as follows. Noting the unit cell Ce22, for example, in FIG. 7 of the embodiment, between a pair of unit cells Ce12 and Ce13 adjacent to each other in the vertical direction, the gate RS22 of the reset transistor R22 and the adjacently placed gate AD12 of the address transistor A12 in the unit cell Ce12 are connected in the pattern. Further, the gate AD22 of the address transistor A22 is connected to the adjacently placed gate RS22 of the reset transistor R32 of the unit cell Ce32 in the pattern. The same pattern configuration is applied to other unit cells Ce in the pixel portion 13 of the CMOS image sensor shown in FIG. 7 of the embodiment. This circuit pattern is indicated by mutual connections of the address line ADL1 with the reset line RSL1, of ADL2 with RSL2, or of ADL3 with RSL3, in FIG. 6.

The reading operation of pixel signals in the CMOS image sensor having above described configuration is explained below.

Firstly, in the same way as with the first and second embodiments, pixel signals of the photodiodes PD11a, PD12a, PD13a, - - - of the unit cells Ce11, Ce12, Ce13, - - - in the first pixel row are read into the signal output lines SL1, SL2, SL3, - - - . Then, pixel signals of the photodiodes PD11b, PD12b, PD13b, - - - in the second pixel row are read. In this process, the gates TG11b, TG12b, TG13b, - - - of the transfer transistors T11b, T12b, T13b, - - - are made open, and signal charges are transferred to the floating junctions FJ11, FJl2, FJ13, - - - . Furthermore, the gates AD11, AD12, AD13, - - - of the address transistors A11, A12, A13, - - - are made open, and signals corresponding to the stored charges are taken out via the diffusion areas S11, S12, S13, - - - to the signal output lines SLl1, SL12, SL13, - - - .

Simultaneously, the gates RS21, RS22, RS23, - - - of the reset transistors R21, R22, R23, - - -, to which the gates AD1, AD12, AD13, - - - of the address transistors A11, A12, A13, - - - are connected, are made open by being applied with an address pulse operating as a reset pulse. The floating junctions FJ21, FJ22, FJ23, - - - are thus reset to predetermined reset drain voltages. The next third pixel row can be read. For reading the subsequent pixel rows, the aforementioned process is repeated.

According to the embodiments mentioned above, in any adjacent two unit cells among the unit cells Ce11, Ce12, Ce13, - - -, which are arranged in the vertical direction, the gates AD11, AD12, AD13, - - - of the address transistors A11, A12, A13, - - - and the gates RS21, RS22, RS23, - - - of the reset transistors R21, R22, R23, - - - are connected in the circuit pattern without connecting with metallic lines, so the integration can be improved more than that in the conventional device as in the first and second embodiments. Further, the resolution in the vertical and horizontal directions can be also improved.

According to the embodiments of the present invention explained above, the elements and lines constituting the pixel portions can be arranged efficiently, and thus the circuit integration can be improved neither reducing the elements size nor forming fine wires, as well as the resolution in the horizontal and vertical directions can be improved.

What is claimed is:

1. A CMOS image sensor comprising:
   a plurality of unit cells arranged in the row and column directions at predetermined pitches of Ph0 and Pv0, respectively, in a two-dimensional plane forming a matrix, each of the unit cells including:
   a first and a second photoelectric conversion element, each of which corresponds to a pixel,
   a first and a second transfer transistor for transferring charges stored by the first and second photoelectric conversion elements to their common floating junction,
   a reset transistor for resetting the potential of the floating junction,
   a driver transistor whose output potential is controlled by the potential of the floating junction, and
   an address transistor for selectively driving the driver transistor;
   reset drain voltage lines provided in the column direction of the matrix arrangement for resetting the potential of common floating junctions included in the unit cells belonging to each column of the matrix arrangement;
   first transfer lines provided in the row direction of the matrix arrangement for controlling first transfer transistors included in the unit cells belonging to each row;
   second transfer lines in the row direction of the matrix arrangement for controlling second transfer transistors included in the unit cells belonging to each row of the matrix arrangement;
   signal output lines provided in the column direction of the matrix arrangement to which output voltages of driver transistors included in the unit cells belonging to each column of the matrix arrangement are supplied, and
   address lines provided in the row direction of the matrix arrangement for selectively driving the driver transistors included in the unit cells belonging to each row, wherein
   first photoelectric conversion elements constituting the respective unit cells and arranged in a horizontal row form a first pixel line,
   second photoelectric conversion elements constituting the respective unit cells and arranged in a horizontal row form a second pixel line adjacent to the first pixel line, and
   the first photoelectric conversion elements arranged in the first pixel lines are dislocated from the respective closest ones of the second photoelectric conversion elements arranged in the second pixel lines by Ph0/2 and Pv0/2 in the horizontal and vertical directions, respectively, to form a checker wise arrangement as a whole.

2. A CMOS image sensor according to claim 1, wherein the first pixel lines composed of the first photoelectric conversion elements included in the unit cells belonging to each row of the matrix arrangement and the second pixel lines composed of the second photoelectric conversion elements included in the unit cells are independently read respectively by the first and second transfer lines.

3. A CMOS image sensor according to claim 2, wherein the first pixel lines and the second pixel lines are read by switching the first and second transfer transistors by the first and second transfer lines.

4. A CMOS image sensor according to claim 3, wherein the driver transistors and the address transistors which are included in the respective unit cells are connected in series, wherein the first and second photoelectric conversion elements are connected to gate electrodes of the driver transistors via the first and second transfer transistors, and wherein source electrodes of the reset transistors are connected to the gate electrodes of the driver transistors.

5. A CMOS image sensor according to claim 4, wherein the first and second photoelectric conversion elements included in the unit cells are spaced by Ph0/2 and Pv0/2 in the horizontal and vertical directions from each other and are formed in a rectangle shape inclined by 45 degrees.

6. A CMOS image sensor according to claim 5, wherein the unit cells are formed as an integrated circuit on a semiconductor substrate and the first and second photoelectric conversion elements of each unit cell arranged in the oblique direction share the floating junction area, the reset drain area, the reset transistors, the driver transistors, the address transistors, the junction area between the driver transistors and the address transistors and the diffusion area at the connecting portion between the driver transistors and the signal output line, thereby reading signals of the first pixel row and the second pixel row independently.

7. A CMOS image sensor comprising:
   a plurality of unit cells arranged in the row and column directions at a predetermined pitch of Ph0 and Pv0, respectively, in a two-dimensional plane forming a matrix, each of the unit cells including:
   a first and a second photoelectric conversion element, each of which corresponds to a pixel,
   a first and a second transfer transistor for transferring charges stored by the first and the second photoelectric conversion elements to their common floating junction,
   a reset transistor for resetting the potential of the floating junction,
   a driver transistor whose output potential is controlled by the potential of the floating junction, and
   an address transistor for selectively driving the driver transistor;
   reset drain voltage lines provided in the column direction of the matrix arrangement for resetting the potential of common floating junctions included in the unit cells belonging to each column of the matrix arrangement;
   first transfer lines provided in the row direction of the matrix arrangement for controlling first transfer transistors included in the unit cells belonging to each row;
   second transfer lines in the row direction of the matrix arrangement for controlling second transfer transistors included in the unit cells belonging to each row of the matrix arrangement;
   first signal output lines provided in the column direction of the matrix arrangement to which output voltages of driver transistors included in the unit cells arranged in the odd numbered rows are supplied;
   second signal output lines provided in the column direction of the matrix arrangement to which the output voltages of the driver transistors included in the unit cells arranged in the even numbered rows are supplied; and address lines provided in the row direction of the matrix arrangement for selectively driving the driver transistors included in the unit cell belonging to each row, wherein image signals of the pixel arrays composed of the photoelectric conversion elements included in the unit cells arranged in the neighboring two columns are read simultaneously using the first and second signal output lines, first photoelectric conversion elements constituting the respective unit cells and arranged in a horizontal row form a first pixel line, second photoelectric conversion elements constituting the respective unit cells and arranged in a horizontal row form a second pixel line adjacent to the first pixel line, and the first photoelectric conversion elements arranged in the first pixel lines are dislocated from the respective closest ones of the second photoelectric conversion elements arranged in the second pixel lines by Ph0/2 and Pv0/2 in the horizontal and vertical directions, respectively, to form a checker wise arrangement as a whole.

8. A CMOS image sensor according to claim 7, wherein adjacent pixel lines, which are read simultaneously, are a pixel row formed by the second photoelectric conversion elements included in unit cells belonging to a first row and a pixel row formed by the first photoelectric conversion elements included in unit cells belonging to a second row, thereby pixels of adjacent two rows are simultaneously read into first and second signal output lines by respectively supplying the same transfer pulse to a second transfer line provided for the unit cells belonging to the first row and a first transfer line provided for the unit cells belonging to the second row.

9. A CMOS image sensor according to claim 8, a gate of a second transfer transistor included in a unit cell belonging to the first row and a gate of a first transfer transistor included in a unit cell belonging to the second row are connected to each other.

10. A CMOS image sensor according to claim 9, wherein a first pixel row composed of the first photoelectric conversion elements included in the unit cells belonging to the respective rows of the matrix arrangement and a second pixel row composed of the second photoelectric conversion elements included in the unit cells are independently read respectively by the first and second transfer lines.

11. A CMOS image sensor according to claim 10, wherein the first pixel row and the second pixel row are read by switching first and second transfer transistors by the first and second transfer lines.

12. A CMOS image sensor according to claim 11, wherein the driver transistors and the address transistors, which are included in the unit cells are connected in series, wherein the first and second photoelectric conversion elements are connected to gate electrodes of the driver transistors via the first and second transfer transistors, and wherein source electrodes of the reset transistors are connected to the gate electrodes of the driver transistors.

13. A CMOS image sensor according to claim 12, wherein the first and second photoelectric conversion elements included in each of the unit cells are spaced by Ph0/2 and Pv0/2 in the horizontal and vertical directions, respectively, from each other and are formed in a rectangular shape inclined by 45 degrees.

14. A CMOS image sensor according to claim 13, wherein the unit cells are formed as an integrated circuit on a semiconductor substrate and wherein the first and second photoelectric conversion elements in each unit cell arranged in the oblique direction share the floating junction area, the reset drain area, the reset transistors, the driver transistors, the address transistors, the junction area between the driver transistors and the address transistors, and the diffusion area at the connecting portion between the driver transistors and the signal output line, thereby reading signals of the first pixel row and the second pixel row independently.

15. A CMOS image sensor according to claim 1, wherein among unit cells arranged in adjacent two rows of the matrix arrangement, a gate of the address transistor included in the unit cell arranged in the first row and a gate of the reset transistor included in the unit cell arranged in the second row are connected, and while an image signal from the second photoelectric conversion element included in the unit arranged in the first row is being read, the floating junction included in the unit cell arranged in the second row to be read next is reset, thus an image signal from the first photoelectric conversion element included in the unit cell arranged in the second row can be read.

16. A CMOS image sensor according to claim 15, wherein a first pixel row composed of the first photoelectric conversion element included in the unit cell belonging to each row of the matrix arrangement and a second pixel row composed of the second photoelectric conversion element included in the unit cell are independently read by the first and second transfer lines.

17. A CMOS image sensor according to claim 16, wherein the first pixel row and the second pixel row are read by switching the first and second transfer transistors by the first and second transfer lines.

18. A CMOS image sensor according to claim 17, wherein the driver transistors and the address transistors which are included in the unit cells are connected in series, and the first and second photoelectric conversion elements are connected to gate electrodes of the driver transistors via the first and second transfer transistors, and source electrodes of the reset transistors are connected to the gate electrodes of the driver transistors.

19. A CMOS image sensor according to claim 17, wherein the first and second photoelectric conversion elements included in each unit cell are spaced by Ph0/2 and Pv0/2 in the horizontal and vertical directions, respectively, from each other and are formed in a rectangular shape inclined by 45 degrees.

20. A CMOS image sensor according to claim 19, wherein unit cells are formed as an integrated circuit on a semiconductor substrate and the first and second photodiodes arranged in the oblique direction share the floating junction area, the reset drain area, the reset transistors, the driver transistors, the address transistors, the junction area between the driver transistors and the address transistors and the diffusion area at the connecting portion between the driver transistors and the signal output line, thereby read signals of the first pixel row and the second pixel row independently.

* * * * *